(12) United States Patent
Lang et al.

(10) Patent No.: US 7,626,530 B2
(45) Date of Patent: Dec. 1, 2009

(54) SYSTEM AND METHOD FOR IMPROVING LINEARITY OF ELECTRONIC CIRCUITS WITH MECHANICAL OSCILLATORS

(75) Inventors: Christoph Lang, Cupertino, CA (US); Johan Vanderhaegen, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/113,404

(22) Filed: May 1, 2008

(65) Prior Publication Data
US 2009/0273499 A1 Nov. 5, 2009

(51) Int. Cl.
*H03M 1/06* (2006.01)
(52) U.S. Cl. ........................................ 341/155; 341/118
(58) Field of Classification Search .................. 341/155, 341/118, 120; 331/116, 182
See application file for complete search history.

(56) References Cited

U.S. PATENT DOCUMENTS

| | | | |
|---|---|---|---|
| 6,278,337 B1 | 8/2001 | Chan et al. | |
| 7,382,206 B2 * | 6/2008 | Park et al. | 331/182 |
| 7,443,257 B2 * | 10/2008 | Demma | 331/116 M |
| 2006/0238260 A1 | 10/2006 | Demma | |

\* cited by examiner

*Primary Examiner*—Peguy JeanPierre
(74) *Attorney, Agent, or Firm*—Maginot, Moore & Beck

(57) ABSTRACT

A system converts an analog input signal to an output signal in a very linear manner using very low chip area and very low power consumption. The system includes a micro electromechanical oscillating signal source for generating a linearly varying oscillating signal, an analog signal generator coupled to the micro electromechanical oscillating signal source, the analog signal generator being configured to convert the linearly varying oscillating signal to an electrical analog signal, a minimum transistor circuit having an input for receiving an analog signal, a switch that selectively couples the electrical analog signal to the input of the minimum transistor circuit, the minimum transistor circuit being configured to process the electrical analog signal and generate digital output values, an error detection circuit coupled to the minimum transistor circuit to detect non-linearity errors in the digital output values, and a linearity correction circuit coupled to the error detection circuit, the linearity correction circuit being configured to compensate for the non-linearity errors detected by the error detection circuit.

19 Claims, 1 Drawing Sheet

SYSTEM AND METHOD FOR IMPROVING LINEARITY OF ELECTRONIC CIRCUITS WITH MECHANICAL OSCILLATORS

TECHNICAL FIELD

This disclosure relates generally to micro electromechanical system (MEMS) circuits and, more particularly, to circuits at an interface between analog signal and digital signal processing domains.

BACKGROUND

Many applications in which electronic circuits are used require the generation of signals related to physical parameters, such as, position, angle, velocity, acceleration, temperature, pressure, force, strain, luminosity, and fluid flow rate. Where the size and the cost of the electronic circuits are not of paramount importance, these parameters may be sensed with large scale transducers that generate analog signals. These analog signals may be connected to analog circuits for processing. Some analog signal processing circuits have been implemented within integrated circuits. The transistors in these analog circuits require substantially longer channels and consume more power than transistors in digital circuits. Digital transistors cannot be used to process these analog signals because they do not operate with precise linearity over the range of the analog signals. Consequently, the analog circuits for processing the analog signals representing physical parameters cannot be miniaturized to the extent that digital circuits can be miniaturized.

Technological advances have enabled some of these physical parameters to be measured fairly accurately with the use of monolithic integrated and micro electromechanical systems (MEMS). The physical responses of these systems may be converted to analog signals. These signals, however, require conversion to digital signals before they can be connected to digital signal processing circuits that are comprised of digital transistors. These digital transistors are close to the minimum feature size possible with known fabrication processes. As used in this document, "minimum transistors" refer to minimum feature size transistors that are typically used for digital signal processing. These transistors usually consume less power when operated than transistors in typical analog signal circuits. "Minimum" refers to the size of a transistor and the power consumption for the transistor during its operation. "Analog transistors" refers to transistors having long channel lengths that are useful for analog signal processing. These transistors typically consume more power than minimum transistors. Typically, the ratio of analog transistor channel lengths to minimum transistor channel lengths is approximately 10:1. Size, weight, cost, and power consumption of circuits for processing signals from sensors are very important issues, especially when the sensors are embedded ubiquitously in an environment. Low cost sensor modules, which are small, accurate, reliable, and easily interfaced with other control circuits for an application, are desirable.

SUMMARY

A system has been developed that enables minimum transistors to be used in analog signal sensor modules. The system includes a micro electromechanical oscillating signal source for generating a linearly varying oscillating signal, an analog signal generator coupled to the micro electromechanical oscillating signal source, the analog signal generator being configured to convert the linearly varying oscillating signal to an electrical analog signal, a minimum transistor circuit having an input for receiving an analog signal, a switch that selectively couples the electrical analog signal to the input of the minimum transistor circuit, the minimum transistor circuit being configured to process the electrical analog signal and generate digital output values, an error detection circuit coupled to the minimum transistor circuit to detect non-linearity errors in the digital output values, and a linearity correction circuit coupled to the error detection circuit, the linearity correction circuit being configured to compensate for the non-linearity errors detected by the error detection circuit.

The system may be used to implement a method for generating compensation values to correct non-linearity errors in a digital linearly varying oscillating signal. The method includes generating a linearly varying oscillating mechanical signal, converting the linearly varying oscillating mechanical signal to an electrical analog signal, processing the electrical analog signal with a minimum transistor circuit to generate digital values corresponding to the electrical analog signal, detecting non-linearity errors in the digital values, and generating compensation values to correct the non-linearity errors detected in the digital values.

BRIEF DESCRIPTION OF THE DRAWINGS

The foregoing aspects and other features of a method and system that enable a minimum transistor circuit to process an analog signal are explained in the following description, taken in connection with the accompanying drawings, wherein.

DETAILED DESCRIPTION

Figure 1:
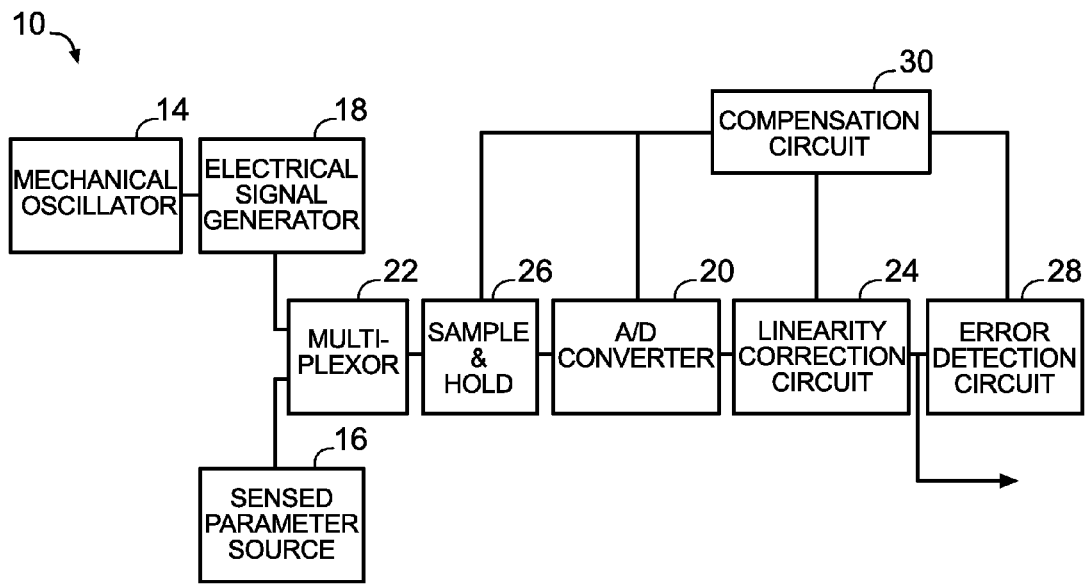
FIG. 1 is a block diagram of a system that generates compensation values that correct non-linearity errors in the digital output of a minimum transistor circuit.

A system 10 that enables a minimum transistor circuit to convert an analog signal to a digital output signal and compensate for nonlinearities in the digital output is shown in FIG. 1. The system includes a micro electromechanical oscillating signal source 14, an analog signal generator 18, a signal multiplexer 22, a sample and hold circuit 26, an analog/digital (A/D) converter 20, and a linearity correction circuit 24. The micro electromechanical oscillating signal source 14 may be a micro mechanical oscillator or a micro electromechanical system (MEMS) resonator. A micro mechanical oscillator includes a mechanical oscillating member and is typically manufactured using nanofabrication techniques. Such an oscillator may be, for example, a spring mass system. In another example, a micro mechanical oscillator may be fabricated on a semiconductor substrate, such as silicon, with a permanent electrically or magnetically polarized material that engages an oscillating member. This structure may be designed and fabricated using integrated circuit techniques to form a MEMS that operates at a desired resonant frequency, which may be a few hundred MHz to several GHz. The oscillating displacement of the oscillating member generates a linearly varying oscillating signal having a high quality or Q factor.

The analog signal generator 18 is a transducer that is mechanically coupled to the micro electromechanical oscillating signal source 14. The analog signal generator 18 is configured in a known manner to convert the linearly varying oscillating mechanical signal to an electrical analog signal.

The analog signal generator is fabricated with analog transistors that generate an electrical analog signal, which corresponds to the linearly varying oscillating mechanical signal and which is composed primarily of a frequency component at the resonant frequency of the mechanical signal. Although the analog transistors of the analog signal generator consume more of the semiconductor substrate than the minimum transistors discussed below, the disproportionate share of the substrate utilization is tolerable to obtain an electrical signal exhibiting the high Q factor of the micro electromechanical system signal source.

The electrical analog signal is coupled to one input of a multiplexer 22. The other input of the multiplexer 22 is coupled to an analog signal source 16 for a parameter that is to be measured by the A/D converter 20. The multiplexer 22 operates under the control of a microprocessor or other controller (not shown). The controller operates the multiplexer 22 as a switch that couples the reference signal from the generator 18 to the A/D converter 20 to enable the generation of the non-linearity compensation values. The non-linearity compensation values help ensure that the response of the A/D converter remains linear. Once the non-linearity compensation values have been identified and stored in the linearity correction circuit 24, the multiplexer 22 is operated to open the switch coupling the signal from the generator 18 to the A/D converter and to close the switch that couples the analog signal for the parameter to be measured to the A/D converter 20. Thus, the multiplexer 22 is operated to verify the linearity of the A/D converter's response and to generate the non-linearity compensation values required to maintain the linearity of the converter's response.

A sample and hold circuit 26 couples the analog/digital (A/D) converter 20 to the output of the multiplexer 22. The sample and hold circuit operates in a known manner to obtain a signal level of the varying signal on the input and provide the sampled signal level to the A/D converter. Depending on the state of the multiplexer 22, the sample and hold circuit 26 receives either the analog reference signal for generation of the non-linearity compensation values or the analog parameter signal to be measured by the A/D converter 20. The analog/digital converter is configured in a known manner to convert the samples of the electrical analog signal received from the sample and hold circuit 26 into digital values. The precision required for the measurement of the parameter signal determines the number of bits in the digital values generated by the A/D converter 20. In one embodiment, the A/D converter 20 generates twelve bit digital values.

The linearity correction circuit 24 provides the required linearity for the digital values generated by the A/D converter 20. In one embodiment, the linearity correction circuit 24 is a look up table that maps the non-Linear digital values received from the A/D converter 20 into a linear response range. That is, each digital value that can be generated by the A/D converter 20 is within the address space for the look up table. The contents of the memory locations accessed in the address space are mapped to digital values that provide a linearly varying signal over the output range of the D/A converter. The contents of the address locations in a look up table are originally the same as the address of the locations. As the error correction circuit and compensation circuit operate to generate correction values, as described in more detail below, the correction values are stored in appropriate locations in the linearity correction circuit to map the output of the D/A converter to more linearly varying values. A look up table, however, is merely an example of a linearity correction circuit and other circuits may be used that achieve the same purpose. As noted earlier, the output of the linearity correction circuit may be provided to the digital circuitry that uses the digital measurement for further processing.

The error detection circuit 28 analyzes the digital output of the linearity detection circuit 24 to identify non-linearity errors in the corrected digital output. One method for detecting errors in the corrected output is frequency analysis. Because the resonant frequency of the reference signal is known, the appearance of other frequencies in the output indicates non-linear errors. These frequencies and their magnitudes may be provided to the compensation circuit 30 to identify compensation values that remove the non-linearity errors identified by the frequency components generated by the error correction circuit 28.

In one embodiment, the error detection circuit 28 is a digital signal analyzer. The digital signal analyzer is configured to identify frequency components in the compensated digital values received from the linearity correction circuit. For example, frequency components in the corrected digital values may be identified by applying a Fourier transform to the output of the linearity correction circuit. A Fourier transform may be applied using a Fast Fourier Transform (FFT) implementation or a Discrete Fourier Transform (DFT) method. The frequency analysis identifies harmonics, for example, that may be introduced into the output of the linearity correction circuit output by environmental conditions, for example. The appearance of frequency components other than the resonant frequency of the oscillating signal source indicates degradation of the linearity of the correction circuit output.

The amplitude and identity of the frequency components may be provided to the compensation circuit 30 that is coupled to the digital signal analyzer. The compensation circuit 30 is configured to minimize the frequency components identified in the compensated digital values other than the resonant frequency of the oscillating signal source 14. In one embodiment, the compensation circuit 30 is configured to compute a least mean square minimization of the frequency components other than the resonant frequency of the oscillating signal source 14, although other techniques, such as regression analysis may be used. The minimization technique implemented by the compensation circuit 30 identifies compensation values. In one embodiment, the error detection circuit 28 and the compensation circuit 30 are implemented with a digital signal processor (DSP) or an embedded microcontroller, such as the microcontroller 8051, which is available from Intel. The microcontroller executes programmed instructions stored in a memory associated with the microcontroller to implement the FFT or DFT and the minimization analysis to generate the compensation values.

In general, the digital values from the A/D converter are coupled to the linearity correction circuit 24, which corrects non-linearities in the digital output signal. The corrected digital values generated by the non-linearity correction circuit are provided to a digital circuit for use of the digital measurement and to the error detection circuit 28, the output of which is coupled to a compensation circuit 30. The extremely accurate reference signal enables the error detection circuit 28 to identify more precisely the non-linearity errors in the digital values of the converter 20 so the compensation circuit 30 generates more accurate compensation values. The compensation values made possible by the precise reference signal enables the A/D converter to be implemented with CMOS or other small scale minimum transistors without suffering significant non-linearity errors in the digital output values. In one embodiment, the compensation values generated by the compensation circuit 30 are stored in the linearity correction circuit 24. For example, corrected values for mapping the output values of the A/D converter to a linear response may be stored at appropriate locations in a look-up table to implement the linearity correction circuit 24. In another embodiment, the compensation values are used to adjust components or parameters for the operation of the A/D converter. For example, input capacitors of an A/D converter may be adjusted to achieve better uniformity in the values of the input capacitors. In another embodiment, both types of compensation are used. For example, the compensation values may be used to adjust the input capacitor values and then compensation values that adjust for non-linearity errors remaining in the corrected output may be identified and stored in the linearity correction circuit 24 or vice versa. The embodiment providing both types of compensation is shown in FIG. 1.

Figure 2:
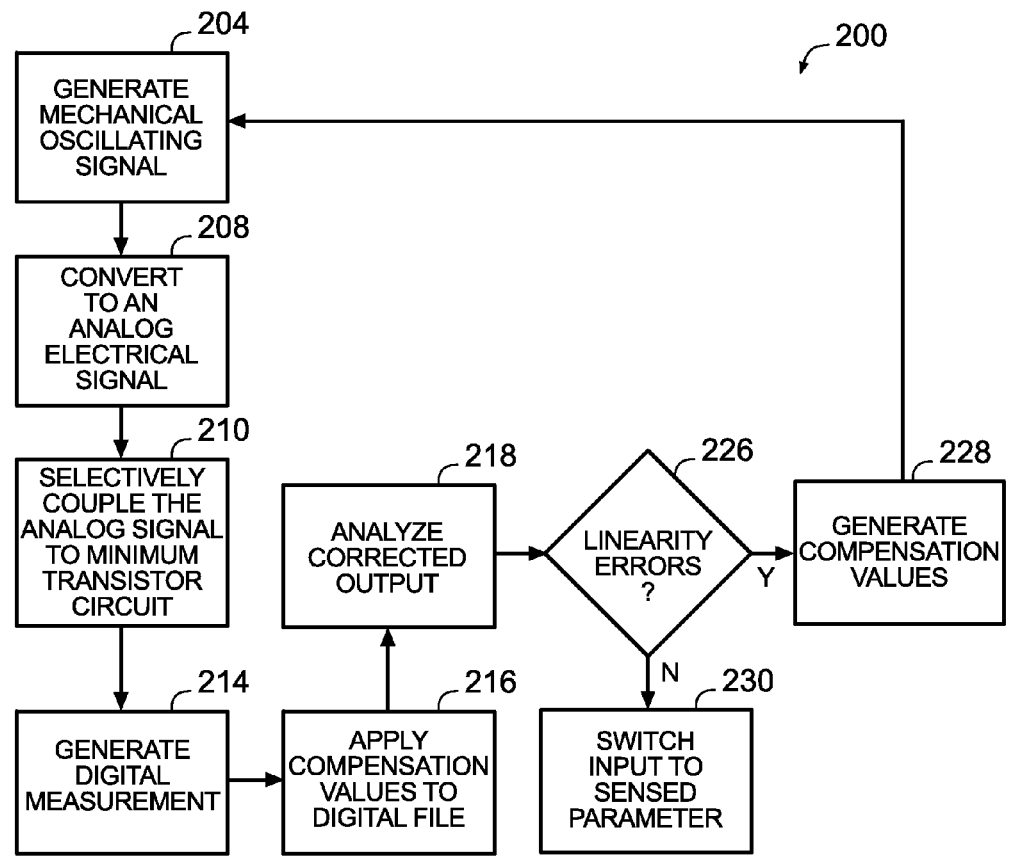
FIG. 2 is a flow diagram of a process for generating compensation values that correct non-linearity errors in the digital output of a minimum transistor circuit.

A method for operating a highly linear converter system is shown in FIG. 2. The method 200 begins with the generation of a linearly varying oscillating mechanical or electromechanical signal (block 204). As noted above, the linearly varying oscillating signal may be generated with a micro mechanical oscillator or a micro electromechanical system resonator. The linearly varying oscillating signal is converted to an electrical analog signal (block 208). The electrical analog signal is selectively coupled to a minimum transistor circuit (block 210). The electrical analog signal is processed by the digital circuit, which generates a digital measurement of the signal (block 214), and compensation values are applied to the digital measurement (block 216). The measurement signal is also analyzed for non-linearity errors (block 218) and compensation values are generated to reduce the non-linearity errors, if errors are detected (blocks 226, 228). The process then continues to determine whether the compensation values sufficiently removed the non-linearity errors. If no errors are detected, the input to the minimum transistor circuit is switched to measure the sense parameter (block 230). The compensation values may be stored in the correction circuit that adjusts the output of the minimum transistor circuit, used to adjust operational parameters of the minimum transistor circuit, or a combination of adjusting the operational parameters and storing modified compensation values in the correction circuit.

The error detection of the method 200 may include identification of frequency components in the corrected digital values. This identification may include analysis of the corrected digital values using FFT or DFT techniques. If frequency components, other than a resonant frequency of the linearly varying oscillating signal, are detected, a minimization technique may be used to generate the compensation values. The frequency component minimization may include computing a least mean square minimization of the frequency components other than the resonant frequency of the linearly varying oscillating signal.

Those skilled in the art will recognize that numerous modifications can be made to the specific implementations described above. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

We claim:

1. A system that enables a minimum transistor circuit to process analog signals comprising:
   a micro electromechanical oscillating signal source for generating a linearly varying oscillating signal;
   an analog signal generator coupled to the micro electromechanical oscillating signal source, the analog signal generator being configured to convert the linearly varying oscillating signal to an electrical analog signal;
   a minimum transistor circuit having an input for receiving the electrical analog signal;
   a switch that selectively couples the electrical analog signal to the input of the minimum transistor circuit, the minimum transistor circuit being configured to process the electrical analog signal and generate digital output values;
   an error detection circuit coupled to the minimum transistor circuit to detect non-linearity errors in the digital output values; and
   a linearity compensation circuit coupled to the error detection circuit, the linearity correction circuit being configured to generate compensation values for correcting the non-linearity errors detected by the error detection circuit.

2. The system of claim 1, the micro electromechanical oscillating signal source being a micro mechanical oscillator.

3. The system of claim 1, the micro electromechanical oscillating signal source being a MEMS resonator.

4. The system of claim 1 further comprising:
   a linearity correction circuit that is configured to apply compensation values to the digital values generated by the minimum transistor circuit to correct linearity errors.

5. The system of claim 4, the linearity correction circuit being a look up table that maps the digital values generated by the minimum transistor circuit to a linear response range.

6. The system of claim 1, the error detection circuit further comprising:
   a digital signal analyzer that is configured to identify frequency components in the digital values generated by the minimum transistor circuit; and
   the linearity correction circuit being coupled to the digital signal analyzer to minimize the frequency components identified in the digital values other than a resonant frequency of the micro electromechanical oscillating signal source.

7. The system of claim 6, the linearity correction circuit being configured to compute a least mean square minimization of the frequency components other than the resonant frequency of the micro electromechanical oscillating signal source.

8. The system of claim 6, the digital signal analyzer being configured to perform a Fast Fourier Transform of the compensated digital values to identify the frequency components.

9. The system of claim 6, the digital signal analyzer being configured to perform a Discrete Fourier Transform of the compensated digital values to identify the frequency components.

10. The system of claim 6 further comprising:
    a digital signal processor configured to implement the digital signal analyzer and the linearity correction circuit.

11. A method for generating a digital linearly varying oscillating signal comprising:
    generating a linearly varying oscillating mechanical signal;
    converting the linearly varying oscillating mechanical signal to an electrical analog signal;
    processing the electrical analog signal with a minimum transistor circuit to generate digital values corresponding to the electrical analog signal;
    detecting non-linearity errors in the digital values; and
    generating compensation values to correct the non-linearity errors detected in the digital values.

12. The method of claim 11, the generation of the linearly varying oscillating mechanical signal comprising:
operating a micro mechanical oscillator.

13. The method of claim 11, the generation of the linearly varying oscillating mechanical signal comprising:
operating a MEMS resonator.

14. The method of claim 11, the generation of the compensation values comprising:
mapping the non-linear digital values into a linear response range.

15. The method of claim 11 further comprising:
identifying frequency components in the generated digital values; and
minimizing the identified frequency components other than a resonant frequency of the linearly varying oscillating signal in the digital values.

16. The method of claim 15, the frequency component minimization comprising:
computing a least mean square minimization of the identified frequency components other than the resonant frequency of the linearly varying oscillating signal.

17. The method of claim 15, the frequency component minimization further comprising:
performing a regression analysis on the frequency components other than the resonant frequency of the linearly varying oscillating signal.

18. The method of claim 15, the frequency component identification further comprising:
performing a Fast Fourier Transform on the compensated digital values.

19. The method of claim 15, the frequency component identification further comprising:
performing a Discrete Fourier Transform on the compensated digital values.

* * * * *